United States Patent
Huang et al.

(10) Patent No.: US 6,200,859 B1
(45) Date of Patent: Mar. 13, 2001

(54) METHOD OF FABRICATING A SPLIT-GATE FLASH MEMORY

(75) Inventors: Chih-Mu Huang, Hsinchu; Jung-Yu Tsai; Shing-Hwa Renn, both of Taipei-Hsien; Shu-Huei Lin, Hsinchu, all of (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/454,419

(22) Filed: Dec. 3, 1999

(30) Foreign Application Priority Data

Nov. 16, 1999  (TW) .................................................. 88119924

(51) Int. Cl.[7] .................................................. H01L 21/336
(52) U.S. Cl. ........................... 438/264; 438/266; 438/593; 438/594
(58) Field of Search ..................................... 257/316, 321, 257/324, 326; 438/263, 264, 266, 261, 593, 594

(56) References Cited

U.S. PATENT DOCUMENTS

| 5,278,087 | * | 1/1994 | Jenq | 438/266 |
| 5,879,992 | * | 3/1999 | Hsieh et al. | 438/264 |
| 5,940,706 | * | 8/1999 | Sung et al. | 438/261 |
| 5,970,371 | * | 10/1999 | Hsieh et al. | 438/593 |
| 6,069,042 | * | 5/2000 | Chien et al. | 438/266 |
| 6,093,608 | * | 7/2000 | Lin et al. | 438/266 |
| 6,121,088 | * | 9/2000 | Lin et al. | 438/264 |

* cited by examiner

*Primary Examiner*—Olik Chaudhuri
*Assistant Examiner*—Hoai Pham
(74) *Attorney, Agent, or Firm*—Jiawei Huang; J C Patents

(57) ABSTRACT

A split-gate flash memory is formed by a method described in the following steps. A tunnelling oxide layer, a first conductive layer, and a hard mask layer are formed on a substrate in sequence. A drain opening and a floating gate opening are formed on the hard mask layer by defining the hard mask layer in order to expose the first conductive layer. A first polyoxide layer and a second polyoxide layer are formed on the first conductive layer exposed by the drain opening and the floating gate opening, respectively. The first polyoxide layer and the first conductive layer beneath the first polyoxide layer are removed to expose the substrate in the drain opening. A drain region is formed in the substrate in the drain opening. The hard mask layer is removed, and the first conductive layer is etched into a floating gate using the second polyoxide layer as a mask. A split-gate oxide layer and a second conductive layer are formed on the resulting structure in sequence. A control gate is formed by defining the second conductive layer, and a source region beside the floating gate is formed in the substrate.

20 Claims, 4 Drawing Sheets

US 6,200,859 B1

METHOD OF FABRICATING A SPLIT-GATE FLASH MEMORY

CROSS-REFERENCE TO RELATED APPLICATION

This application claims the priority benefit of Taiwan application ser. no. 88119924, filed Nov. 16, 1999.

BACKGROUND OF THE INVENTION

1. Field of the Invention

The invention relates to a method for fabricating a flash memory, and more particularly, to a method for fabricating a split-gate flash memory.

2. Description of the Related Art

At present, nonvolatile memory is widely used in the whole range of electrical devices. In particular, programmable nonvolatile memory having a flash memory structure such as the erasable programmable read-only memory and electrically erased programmable read-only memory has attracted immense interest. In general, a flash memory comprises two gates, a floating gate for charge storage and a control gate for data accessing. The floating gate is in a floating state without being connected to any electrical circuit and is located between the control gate and a substrate while the control gate is connected to a word line.

FIG. 1 is a schematic, cross-sectional view showing a structure of a split-gate flash memory according to the prior art. In the FIG. 1, a floating gate 102 and a control gate 104 are formed on a substrate 100. A split-gate oxide layer 106 and a dielectric layer 108 separate the floating gate 102 and the control gate 104. Source/drain regions 110a, 110b are respectively formed in the substrate 100 adjacent to the collective structure of the control gate 104 and the floating gate 102. Sometimes, the control gate 104 is referred to as a selective gate. Referring to FIG. 1, the semiconductor process is first to form the floating gate 102 on the substrate 100 and then to form the split-gate oxide layer 106. Subsequently, a conductive layer is formed on the split-gate oxide layer 106. Then, the conductive layer is defined into the control gate 104 as shown in FIG. 1 by photolithography and etching. Afterwards, an ion implantation process is performed to form the source/drain regions 110a, 110b. A distance $L_1$ covered by the control gate 104 between the source/drain region 110a and the structure comprising the dielectric layer 108 and the floating gate 102 is referred to as a channel length of the selective gate.

According to the prior art, the process is first to form the control gate 104 and then to form the source/drain region 110a; thus, the channel length $L_1$ of the selective gate depends on the accuracy of photolithography for defining the control gate 104. Thus, when the photomask used for defining the control gate 104 is misaligned and the control gate 104 formed is shifted from a desired position, the channel length $L_1$ is increased or decreased, and the reading current and the programming current are varied with the length $L_1$. When the length $L_1$ is increased, the reading current is reduced; thus, a sensitive sense amplifier is required for detecting the reading current. In addition, the programming current is also reduced while the length $L_1$ is increased; thus, the time for programming is increased, the speed becomes slower, and the operation time is increased.

SUMMARY OF THE INVENTION

According to above, the invention provides a method for fabricating a split-gate flash memory. According to the invention, a drain region and a floating gate are formed before a selective gate is formed in order to fix the distance between the drain region and the floating gate and to decide a channel length thereby. Thus, the invention can stably provide a reading current and a programming current and enhance the reliability of a device.

The invention provides a method for fabricating a split-gate flash memory. The method comprises the following steps.

A tunnelling oxide layer, a first conductive layer, and a hard mask layer are formed on a substrate in sequence. A drain opening and a floating gate opening are formed on the hard mask layer by defining the hard mask layer in order to expose the first conductive layer. A first polyoxide layer and a second polyoxide layer are formed on the first conductive layer exposed by the drain opening and the floating gate opening, respectively. The first polyoxide layer and the first conductive layer beneath the first polyoxide layer are removed to expose the substrate in the drain opening. A drain is formed in the substrate in the drain opening. The hard mask layer is removed, and the first conductive layer is etched into a floating gate using the second polyoxide layer as a mask. A split-gate oxide layer and a second conductive layer are formed on the resulting structure in sequence. A control gate is formed by defining the second conductive layer, and a source region beside the floating gate is formed in the substrate.

The invention provides another option for the method of fabricating a split-gate flash memory. The option comprises the following steps.

A tunnelling oxide layer, a first conductive layer, and a hard mask layer are formed on a substrate in sequence. A drain opening and a floating gate opening are formed on the hard mask layer by defining the hard mask layer in order to expose the first conductive layer. The first conductive layer exposed in the drain opening is removed to expose the substrate. A drain is formed in the substrate exposed by the drain opening, and an oxide layer is formed on the drain region. A polyoxide layer is formed on the first conductive layer exposed by the floating gate opening. The hard mask layer is removed, and the first conductive layer is etched into a floating gate using the second polyoxide layer as a mask. A split-gate oxide layer and a second conductive layer are formed on the resulting structure in sequence. A control gate is formed by defining the second conductive layer, and a source region beside the floating gate is formed in the substrate.

It is to be understood that both the foregoing general description and the following detailed description are exemplary, and are intended to provide further explanation of the invention as claimed.

DESCRIPTION OF THE PREFERRED EMBODIMENTS

The preferred embodiments of the invention disclose methods for fixing the distance between a drain region and a floating gate in order to ensure the channel length of a selective gate. Thus, the invention can ensure that the position of the selective gate does not vary with the misalignment of the selective gate.

First Preferred Embodiment of the Invention

Figure 1:
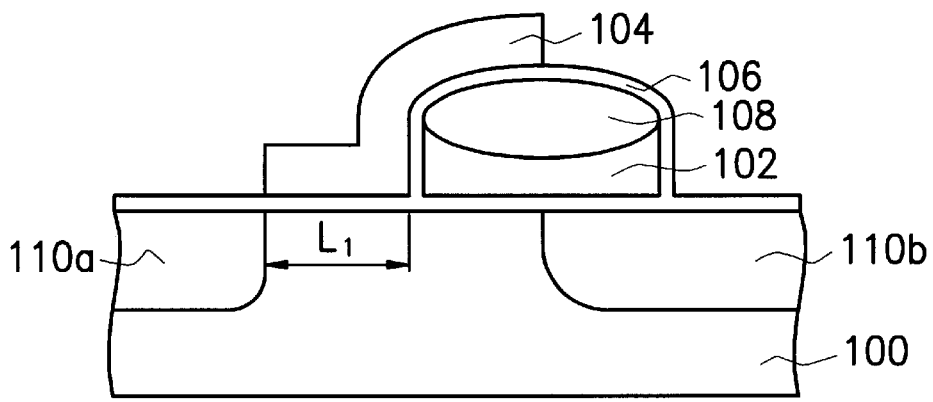
FIG. 1 is a schematic, cross-sectional view showing a structure of a split-gate flash memory according to the prior art.
Figure 2A:
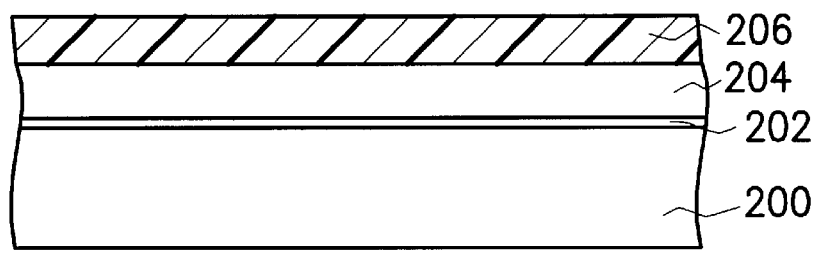
FIG. 2A through FIG. 2I are schematic, cross-sectional views showing a process of fabricating a split-gate flash memory according to a first preferred embodiment of the invention.

FIG. 2A through FIG. 2I are schematic, cross-sectional views showing a process of fabricating a split-gate flash memory according to a first preferred embodiment of the invention. Referring to FIG. 2A, a isolation structure (not shown) of a field oxide layer formed by local oxidation or a shallow trench isolation formed by a shallow trench process is formed to define an active area, and a tunneling oxide layer 202 formed by, for example, thermal oxidation is formed to cover a substrate 200.

In FIG. 2A, a first conductive layer 204 having a thickness of about 1700–2000 Å and comprising polysilicon formed by, for example, chemical vapor deposition is formed to cover the tunneling oxide layer 202. A hard mask 206 having a thickness of about 1500 Å and comprising silicon nitride formed by, for example, chemical vapor deposition is formed to cover the first conductive layer 204.

Figure 2B:
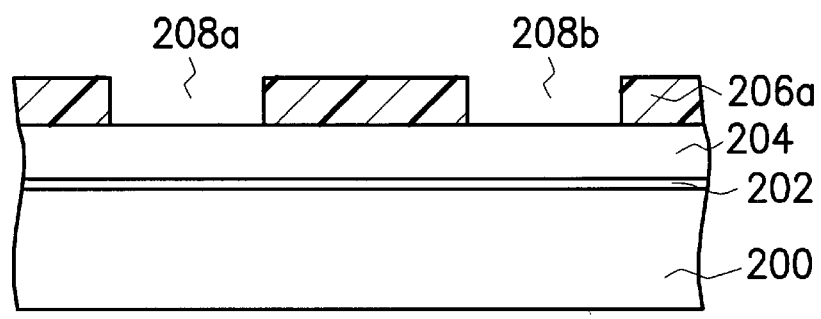

The hard mask layer 206 is defined by photolithography. For example, a photoresist layer is formed on the hard mask layer 206. Then, using the first conductive layer 204 as an etching stop layer, the hard mask layer 206 is defined by the photoresist layer to form a hard mask layer 206a having a drain opening 208a and a floating gate opening 208b on the hard mask layer 206a and to expose the first conductive layer 204 in the openings as shown in FIG. 2B. According to the first preferred embodiment of the invention, the drain opening 208a and the floating gate opening 208b are in their respective desired positions.

Figure 2C:
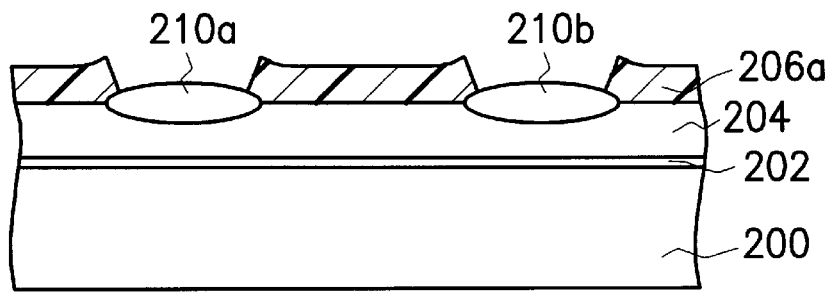

Referring to FIG. 2C, using the hard mask layer 206a as a mask, the first conductive layer 204 exposed by the drain opening 208a and the floating gate opening 208b is oxidized to form a first polyoxide layer 210a and a second polyoxide layer 210b, respectively. For example, the first conductive layer 204 comprising polysilicon is oxidized in an $O_2$ environment to form a polyoxide layer having a thickness of about 1800 Å.

Figure 2D:
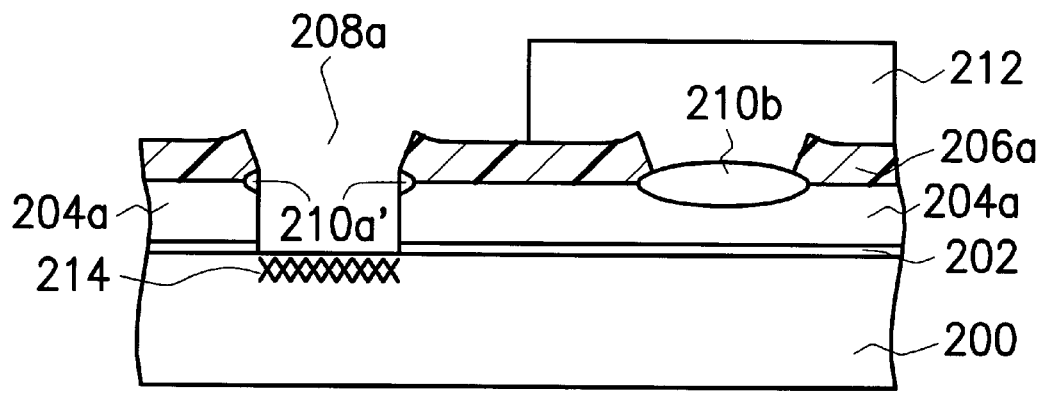

Referring to FIG. 2D, a photoresist layer 212 is formed on the second polyoxide layer 210b and covers portions of the hard mask layer 206b. Using the hard mask layer 206b and the photoresist layer 212 as a mask, first, an anisotropic etching process with an etching recipe for removing oxide is performed to remove the first polyoxide layer 210a to expose the first conductive layer 204 in the drain opening 208a, and an anisotropic etching with an etching recipe for removing the first conductive layer 204 is then performed to remove the first conductive layer 204 in the drain opening 208a to expose the substrate 200 in the drain opening 208a and to form a first conductive layer 204a. The anisotropic etching process is, for example, a plasma etching process. In addition, due to the hard mask 206 and the anisotropic etching process, there may be a remainder 210a' of the first polyoxide layer 210a in the drain opening 208a.

Figure 2E:
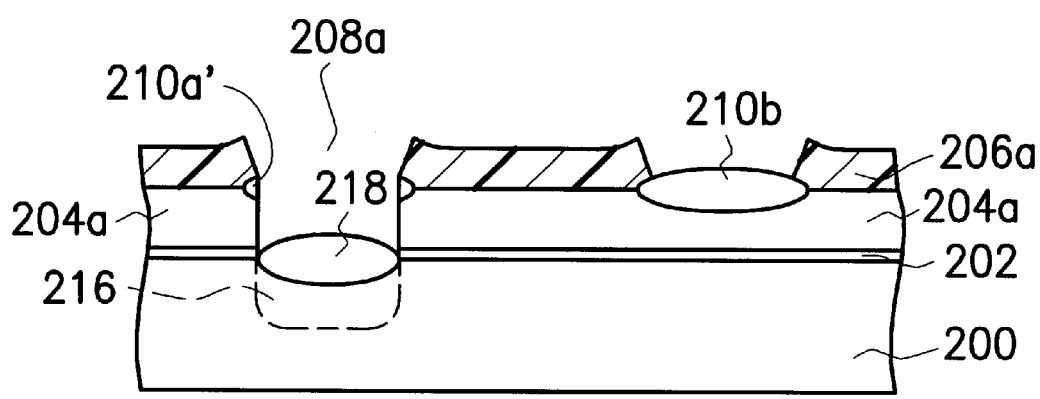

Ions are implanted in the exposed substrate 200 in the drain opening 208a, the photoresist layer 212 is removed, and a drive-in process such as a rapid thermal process for the implanted ions is performed to form a drain 216 as shown in FIG. 2E. Since the drive-in process is performed by a rapid thermal process, an oxide layer 218 is formed on the surface of the substrate 200 in the drain region 216. The oxide layer 218 can prevent the drain region 216 from being damaged by a subsequent etching process.

Figure 2F:
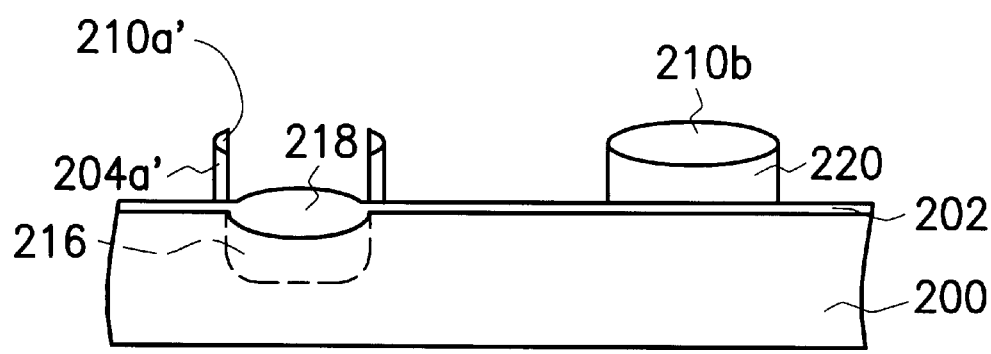

Referring to FIG. 2F, the hard mask layer 206a is removed by, for example, wet etching to expose the first conductive layer 204a covered by the hard mask layer 206a. Using the second polyoxide layer 210b as a mask, an anisotropic etching process such as a plasma etching process is performed to remove the first conductive layer 204a uncovered by the second polyoxide layer 210b in order to form a floating gate 220. Due to the remainder 210a' of the first polyoxide layer 210a, there is a remainder 204a' of the first conductive layer 204a beneath the remainder 210a' during removal of the first conductive layer 204a as shown in FIG. 2F. The remainders 210a' and 204a' are then removed.

Figure 2G:
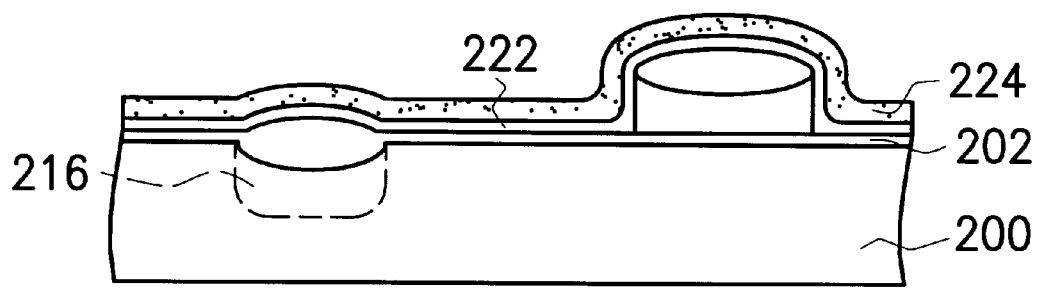

Referring to FIG. 2G, a split-gate oxide layer 222 is formed on the resulting structure. A dielectric layer 224 such as a silicon nitride layer is formed on the split-gate oxide layer 222 and then etched back by, for example, an anisotropic etching process to form dielectric spacers 224a on sidewalls of the floating gate 220 as shown in FIG. 2H.

Figure 2H:
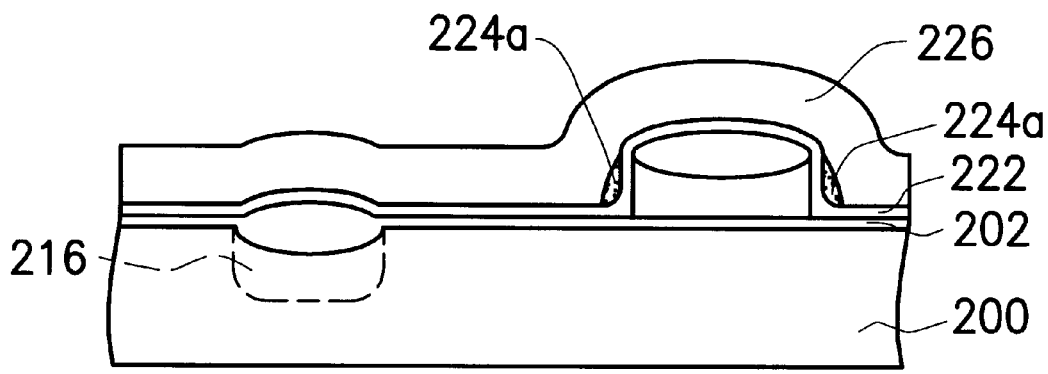
Figure 2I:
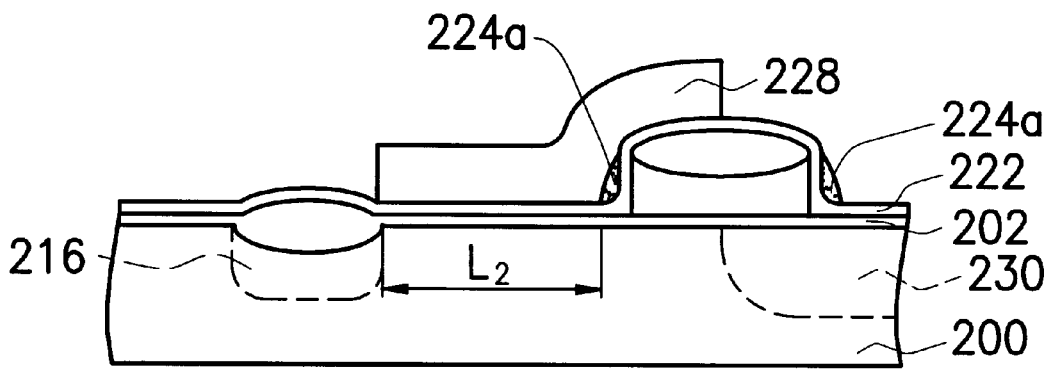

Referring to FIG. 2H, a second conductive layer 226 such as a polysilicon layer is formed on the resulting structure by, for example, chemical vapor deposition. Photolithography is performed to define the second conductive layer 226 in order to form a selective gate 228 as shown in FIG. 2I. An ion implantation is performed to form a source 230 beside the floating gate 220. Since the drain 216 and the floating gate 220 are completed before the selective gate 228 being formed, a channel length $L_2$ of the selective gate 228 is fixed. That is, the channel length $L_2$ of the selective gate 228 is not affected by the misalignment of the selective gate 228. Thus, the flash memory can obtain a stable reading current and a stable programming current.

Second Preferred Embodiment of the Invention

Figure 3A:
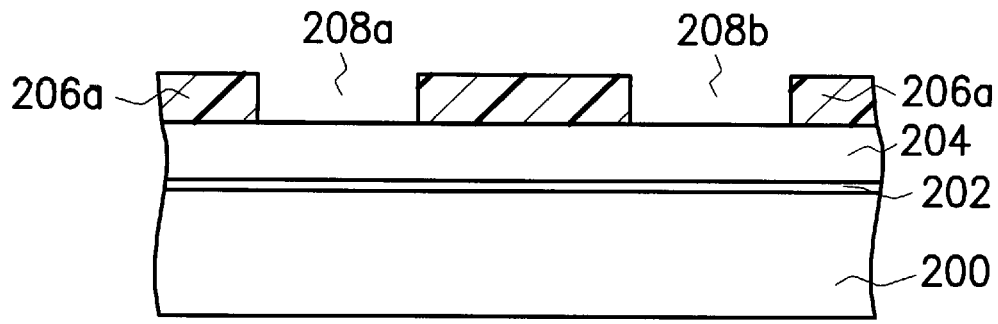
FIG. 3A through FIG. 3C are schematic, cross-sectional views showing a process of fabricating a split-gate flash memory according to a second preferred embodiment of the invention.
Figure 3B:
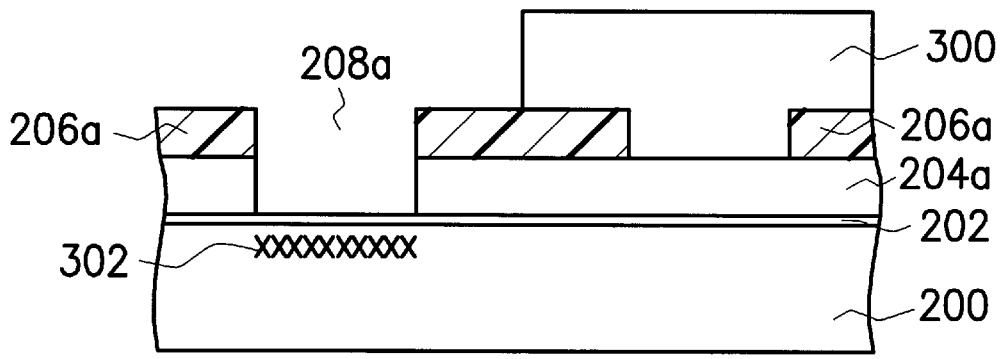
Figure 3C:
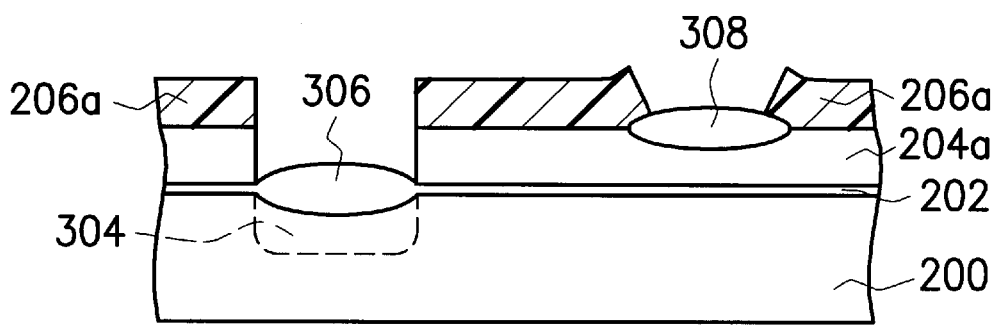

FIG. 3A through FIG. 3C are schematic, cross-sectional views showing a process of fabricating a split-gate flash memory according to a second preferred embodiment of the invention. Description of steps in FIG. 3A that are the same as the steps in FIG. 2A and FIG. 2B of the first preferred embodiment is not repeated here.

Referring to FIG. 3B, a photoresist layer 300 is formed to cover the floating gate opening 208b and portions of the hard mask layer 206a. The first conductive layer 204 exposed by the drain opening 208a is removed by, for example, an anisotropic etching process to expose the substrate 200. Ions 302 are implanted in the exposed substrate 200 in the drain opening 208a.

Referring to FIG. 3C, the photoresist layer 300 is removed to expose the first conductive layer 204a in the floating gate opening 208b, and a drive-in process for the ions 302 is performed to form a drain 304. Since the drive-in process is performed in an $O_2$ environment, the exposed substrate 200 in the drain opening 208a is oxidized into an oxide layer 306, and the exposed first conductive layer 204a in the floating gate opening 208b is oxidized into a polyoxide layer 308. The subsequent steps are the same as those in FIGS. 2F–2I; thus, the details are not repeated.

According to the invention, since the drain and the floating gate are completed before the selective gate is formed, the channel length of the selective gate is fixed. Thus, the channel length of the selective gate is not affected by the misalignment of the selective gate during the selective gate process. As a result, the flash memory can obtain a stable reading current and a stable programming current, and the reliability of the flash memory is enhanced.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method for fabricating a split-gate flash memory, comprising:

forming a tunnelling oxide layer, a first conductive layer, and a hard mask layer on a substrate in sequence;

defining the hard mask layer to form a drain opening and a floating gate opening on the hard mask layer and to expose the first conductive layer;

forming a first polyoxide layer on the exposed first conductive layer of the drain opening and a second polyoxide layer on the exposed first conductive layer of the floating gate opening;

removing the first polyoxide layer and the first conductive layer beneath the first polyoxide layer to expose the substrate;

forming a drain in the exposed substrate;

removing the hard mask layer;

forming a floating gate by etching the first conductive layer while using the second polyoxide layer as a mask;

forming a split-gate oxide layer on the substrate and the floating gate;

forming a second conductive layer on the split-gate oxide layer;

defining the second conductive layer to form a control gate; and forming a source in the substrate beside the floating gate.

2. The method for fabricating the split-gate flash memory according to claim 1, wherein the hard mask layer comprises a silicon nitride layer.

3. The method for fabricating the split-gate flash memory according to claim 1, wherein the first polyoxide layer and the second polyoxide layer are formed by oxidizing the first conductive layer.

4. The method for fabricating the split-gate flash memory according to claim 1, wherein the step performed to remove the first polyoxide layer and the first conductive layer covered by the first polyoxide layer comprises:

forming a photoresist layer to cover the second polyoxide layer; and performing an anisotropic etching process by using the hard mask layer as a mask to remove the first polyoxide layer and the first conductive layer covered by the first polyoxide layer.

5. The method for fabricating the split-gate flash memory according to claim 1, wherein the drain is formed by an ion implantation, and thereafter, a drive-in process is performed to form an oxide layer on a surface of the substrate in the drain.

6. The method for fabricating the split-gate flash memory according to claim 1, wherein the hard mask is removed by wet etching.

7. The method for fabricating the split-gate flash memory according to claim 1, wherein in the step of etching the first conductive layer while using the second polyoxide layer as the mask, the etching is an anisotropic etching process.

8. The method for fabricating the split-gate flash memory according to claim 1, wherein a dielectric spacer on a sidewall of the floating gate is formed before the second conductive layer being formed.

9. The method for fabricating the split-gate flash memory according to claim 1, wherein the first conductive layer comprises a polysilicon layer.

10. The method for fabricating the split-gate flash memory according to claim 1, wherein the second conductive layer comprises a polysilicon layer.

11. A method for fabricating a split-gate flash memory, wherein the method applies to a substrate and comprises:

forming a tunnelling oxide layer, a first conductive layer, and a hard mask layer the substrate in sequence;

defining the hard mask layer to form a drain opening and a floating gate opening on the hard mask layer and to expose the first conductive layer;

removing the first conductive layer in the drain opening to expose the substrate;

forming a drain in the substrate exposed by the drain opening;

forming a polyoxide layer in the first conductive layer exposed by the floating gate opening and an oxide layer on a surface of the substrate;

removing the hard mask layer;

forming a floating gate by etching the first conductive layer while using the second polyoxide layer as a mask;

forming a split-gate oxide layer on the substrate and the floating gate;

forming a second conductive layer on the split-gate oxide layer;

defining the second conductive layer to form a control gate; and forming a source in the substrate beside the floating gate.

12. The method for fabricating the split-gate flash memory according to claim 11, wherein the hard mask layer comprises a silicon nitride layer.

13. The method for fabricating the split-gate flash memory according to claim 11, wherein a process for removing the first conductive layer in the drain opening comprises forming a photoresist layer to cover the floating gate opening and performing an anisotropic etching process while using the hard mask layer as a mask to etch the conductive layer and to expose the substrate.

14. The method for fabricating the split-gate flash memory according to claim 11, wherein the drain is formed by implanting ions in the substrate.

15. The method for fabricating the split-gate flash memory according to claim 11, wherein a polyoxide layer is formed on the first conductive layer exposed by the floating gate opening, and an oxide layer is formed on a surface of the drain during a drive-in process for the drain.

16. The method for fabricating the split-gate flash memory according to claim 11, wherein the hard mask is removed by wet etching.

17. The method for fabricating the split-gate flash memory according to claim 11, wherein in the step of etching the first conductive layer by using the polyoxide layer as the mask, the etching is an anisotropic etching process.

18. The method for fabricating the split-gate flash memory according to claim 11, wherein a dielectric spacer on a sidewall of the floating gate is formed before the second conductive layer being formed.

19. The method for fabricating the split-gate flash memory according to claim 11, wherein the first conductive layer comprises a polysilicon layer.

20. The method for fabricating the split-gate flash memory according to claim 11, wherein the second conductive layer comprises a polysilicon layer.

* * * * *